(12) United States Patent
Fujiwara et al.

(10) Patent No.: US 8,686,809 B2
(45) Date of Patent: Apr. 1, 2014

(54) LADDER-TYPE FILTER INCLUDING A DIELECTRIC FILM HAVING A SIDE SURFACE WITH A HEIGHTWISE INCLINATION

(75) Inventors: Joji Fujiwara, Osaka (JP); Tetsuya Tsurunari, Osaka (JP); Hiroyuki Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 355 days.

(21) Appl. No.: 13/037,663

(22) Filed: Mar. 1, 2011

(65) Prior Publication Data

US 2011/0215884 A1 Sep. 8, 2011

(30) Foreign Application Priority Data

Mar. 2, 2010 (JP) ................... 2010-045146

(51) Int. Cl.
*H03H 9/64* (2006.01)
(52) U.S. Cl.
USPC .................. 333/193; 333/195; 310/313 B
(58) Field of Classification Search
USPC .............. 333/193–196; 310/313 B, 313 D
See application file for complete search history.

(56) References Cited

U.S. PATENT DOCUMENTS

| 5,543,757 | A  | * | 8/1996  | Kobayashi et al. | 333/195 |
| 5,559,481 | A  | * | 9/1996  | Satoh et al.     | 333/193 |
| 5,909,156 | A  | * | 6/1999  | Nishihara et al. | 333/193 |
| 5,999,069 | A  | * | 12/1999 | Ushiroku         | 333/193 |
| 6,292,071 | B1 | * | 9/2001  | Taniguchi        | 333/133 |
| 6,437,662 | B1 | * | 8/2002  | Taniguchi        | 333/133 |
| 6,445,261 | B1 | * | 9/2002  | Yuda et al.      | 333/133 |
| 6,489,863 | B2 | * | 12/2002 | Taniguchi        | 333/193 |
| 6,518,861 | B2 | * | 2/2003  | Taniguchi        | 333/193 |
| 6,570,470 | B2 | * | 5/2003  | Maehara et al.   | 333/133 |
| 6,819,203 | B2 | * | 11/2004 | Taniguchi        | 333/193 |
| 6,919,777 | B2 | * | 7/2005  | Taniguchi et al. | 333/133 |
| 7,327,205 | B2 | * | 2/2008  | Taniguchi        | 333/133 |
| 7,327,206 | B2 | * | 2/2008  | Kishimoto et al. | 333/133 |
| 2005/0212620 | A1 | * | 9/2005 | Bauer et al.    | 333/193 |
| 2009/0289741 | A1 | * | 11/2009 | Ito            | 333/133 |
| 2010/0194496 | A1 |   | 8/2010  | Goto et al.     |         |

FOREIGN PATENT DOCUMENTS

JP   2006-217517     *  8/2006
WO   WO 2009/060594 A1   5/2009

* cited by examiner

*Primary Examiner* — Barbara Summons
(74) *Attorney, Agent, or Firm* — RatnerPrestia

(57) ABSTRACT

A ladder-type filter having plural elastic-wave resonators provided on a series arm and a parallel arm in a ladder shape on a piezoelectric substrate. Each of the elastic-wave resonators has an interdigital electrode. The interdigital electrode has plural electrode finger pairs formed of electrode fingers extending from first and second bus bars. The interdigital electrode included in the elastic-wave resonator provided on the parallel arm has an electrode cross width of the electrode fingers extending from the first and second bus bars 23 times or more of the wavelength of elastic waves excited by the interdigital electrodes.

2 Claims, 6 Drawing Sheets

| Passing characteristics | Electrode cross width D | Number of electrode finger pairs |
|---|---|---|
| (a) | 50μm (12 times λ) | 150 |
| (b) | 75μm (17 times λ) | 100 |
| (c) | 100μm (23 times λ) | 75 |
| (d) | 150μm (35 times λ) | 50 |
| (e) | 200μm (46 times λ) | 37.5 |

LADDER-TYPE FILTER INCLUDING A DIELECTRIC FILM HAVING A SIDE SURFACE WITH A HEIGHTWISE INCLINATION

BACKGROUND OF THE INVENTION

1. Field of the Invention

The present invention relates to a ladder-type filter used for such as a mobile phone and a wireless LAN terminal.

2. Background Art

FIG. 6 is a schematic plan view showing a configuration of a conventional ladder-type filter. As shown in FIG. 6, conventional ladder-type filter 1 has elastic-wave resonators 3, 4 on the series arms and elastic-wave resonators 5, 6 on the parallel arms, arranged in a ladder shape on piezoelectric substrate 2. In ladder-type filter 1, elastic-wave resonator 5 on the parallel arm suppresses spurious emission by the transverse mode around a resonance frequency by interdigital electrodes 5a and 5b connected to each other in series and electrode cross width D1 of interdigital electrode 5a made different from electrode cross width D2 of interdigital electrode 5b.

As information on prior art documents related to the invention of the application, the patent literature (WO2009/060594) is known for example.

To secure enough capacitance of elastic-wave resonator 5 in such conventional ladder-type filter 1, the number of electrode finger pairs of interdigital electrodes 5a and 5b needs to be increased. Accordingly, interdigital electrodes 5a and 5b are extended in the direction of arranging electrode finger pairs, resulting in a larger ladder-type filter 1.

Particularly, to use filter 1 for a low frequency band such as Band 8 defined by UMTS (Universal Mobile Telecommunications System), the distance (pitch) between electrode fingers needs to be increased, resulting in extremely large ladder-type filter 1.

SUMMARY OF THE INVENTION

The present invention, which has been accomplished in view of such conventional problems, provides a ladder-type filter satisfying both suppressing spurious emission by the transverse mode and downsizing.

The present invention is a ladder-type filter having plural elastic-wave resonators provided on the series and parallel arms in a ladder shape on a piezoelectric substrate. Each elastic-wave resonator has an interdigital electrode, which has plural electrode finger pairs formed of electrode fingers extending from first and second bus bars. With the interdigital electrode of the elastic-wave resonator provided on the parallel arm, the electrode cross width of the electrode fingers extending from the first and second bus bars is made 23 times or more of the wavelength of elastic waves excited by the interdigital electrode.

DETAILED DESCRIPTION OF THE INVENTION

Hereinafter, a description is made of an embodiment of the present invention with reference to the related drawings.

Exemplary Embodiment

Figure 1:
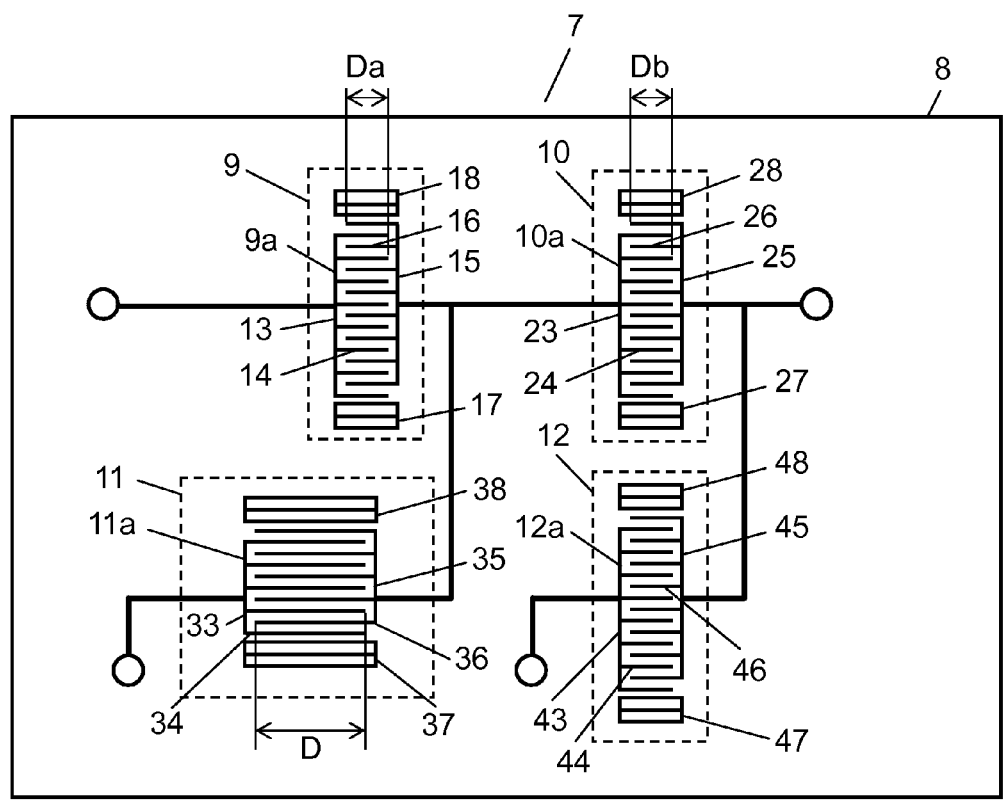
FIG. 1 is a schematic plan view showing a configuration of a ladder-type filter according to an embodiment of the present invention.

FIG. 1 is a schematic plan view showing a configuration of ladder-type filter 7 according to an embodiment of the present invention.

As shown in FIG. 1, ladder-type filter 7 has elastic-wave resonators 9, 10 on the series arms and elastic-wave resonators 11, 12 on the parallel arms, arranged in a ladder shape on piezoelectric substrate 8. Elastic-wave resonators 9, 10, 11, 12 have interdigital electrodes 9a, 10a, 11a, 12a, respectively.

Interdigital electrodes 9a to 12a have plural electrode finger pairs composed of electrode fingers (first electrode finger) 14, 24, 34, 44 extending from first bus bars 13, 23, 33, 43 and electrode fingers (second electrode finger) 16, 26, 36, 46 extending from second bus bars 15, 25, 35, 45 crossing, respectively. Here, interdigital electrodes 9a to 12a may have reflectors 17, 18, 27, 28, 37, 38, 47, 48 on both ends, respectively. In such a case, interdigital electrodes 9a to 12a trap elastic waves in each inside more effectively, thereby increasing respective Q values of interdigital electrodes 9a to 12a.

Hereinafter, a detailed description is made of the components of ladder-type filter 7 according to the embodiment.

Piezoelectric substrate 8 is made of a single-crystal piezoelectric substrate of a board thickness of 100 to 350 μm. Piezoelectric substrate 8 is a substrate based on such as crystal, lithium tantalate, lithium niobate, or potassium niobate.

Hereinafter, a description is made of a case where a substrate based on lithium niobate is used for piezoelectric substrate 8. In the case, the electromechanical coupling factor can be increased, thereby implementing a filter with a broad passband.

Here, by using a lithium niobate substrate of Y cut X propagation with a cut angle −15° to +35°, the electromechanical coupling factor can be further increased. In the following description, a lithium niobate substrate of Y cut X propagation with a cut angle of 5° is used.

Interdigital electrodes 9a through 12a are approximately 0.1 to 0.5 μm in film thickness. The electrodes are formed of one of the following three types of materials: a single metal such as aluminum, copper, silver, gold, titanium, tungsten, platinum, chromium, nickel, or molybdenum; an alloy primarily containing at least one of these metals; or a lamination of at least one of these metals. The electrodes are formed on piezoelectric substrate 8 by sputtering or vapor deposition.

Here, a detailed description is made of interdigital electrode 11a included in elastic-wave resonator 11 on the parallel arm. With interdigital electrode 11a, the electrode cross width of electrode finger 34 extending from first bus bar 33 and electrode finger 36 extending from second bus bar 35 is made 23 times or more of the wavelength of elastic waves excited by interdigital electrode 11a.

In this embodiment, ladder-type filter 7 is used as a transmission filter (passband: 880 to 915 MHz) for Band 8 defined by UMTS. In a case where lithium niobate is used for piezoelectric substrate 8, if a distance (pitch) between electrode fingers 34 and 36 is approximately 2.17 μm, wavelength λ of elastic waves excited by interdigital electrode 11a becomes approximately 4.34 μm, which makes the resonance frequency of interdigital electrode 11a become approximately 880 MHz.

In this embodiment, electrode cross width D of interdigital electrode 11a is made approximately 100 μm, which is approximately 23 times wavelength λ (approximately 4.34 μm) of elastic waves.

Figures 2A, 2B:
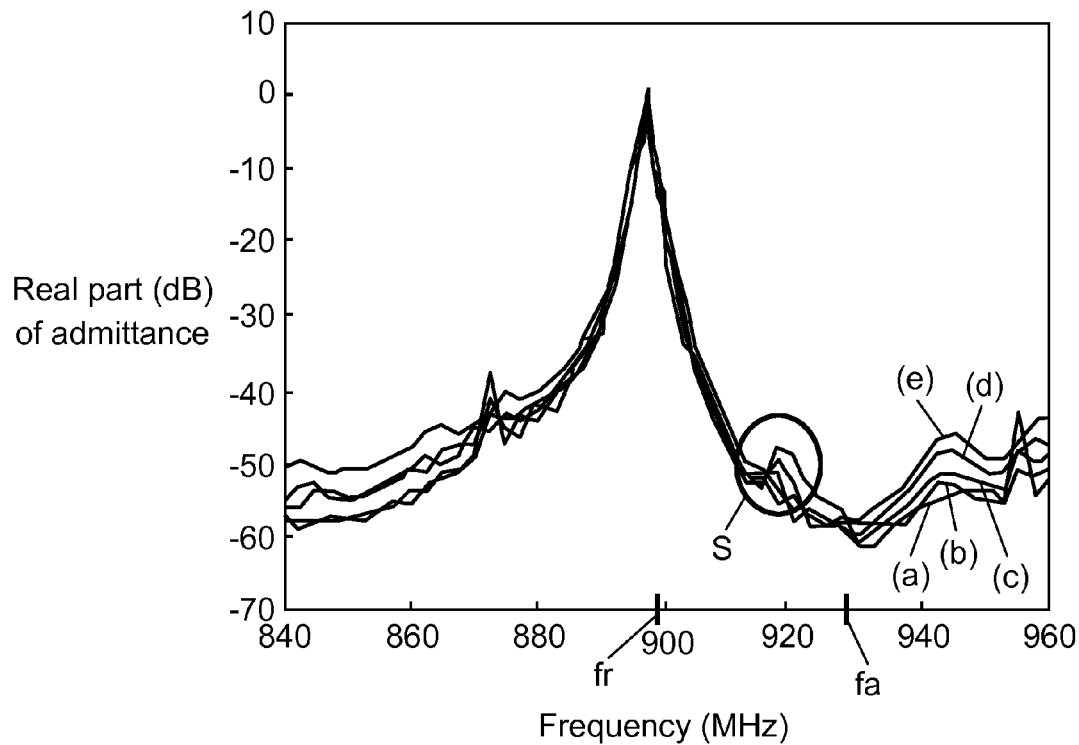
FIG. 2A shows passing characteristics with electrode cross width D and the number of electrode finger pairs changed for the ladder-type filter according to the embodiment of the present invention.
FIG. 2B shows conditions between electrode cross width D and the number of electrode finger pairs in each of the passing characteristics shown in FIG. 2A.

FIG. 2A shows passing characteristics with electrode cross width D and the number of electrode finger pairs changed for ladder-type filter 7 according to the embodiment of the present invention. In FIG. 2A, the horizontal axis represents the frequency; the vertical axis, the admittance.

FIG. 2B shows conditions between electrode cross width D and the number of electrode finger pairs in each of the passing characteristics shown in FIG. 2A.

As shown in FIG. 2B, passing characteristics (a) show a case where electrode cross width D of interdigital electrode 11a is 50 μm (12 times λ) and the number of electrode finger pairs is 150.

Similarly, passing characteristics (b) show a case where electrode cross width D of interdigital electrode 11a is 75 μm (17 times λ) and the number of electrode finger pairs is 100; (c), 100 μm (23 times λ), 75; (d), 150 μm (35 times λ), 50; (e), 200 μm (46 times λ), 37.5.

Here, each of passing characteristics (a) through (e) shows a case where electrode cross width D and the number of electrode finger pairs are set so that the capacitance of interdigital electrode 11a remains the same. Passing characteristics (a) and (b) show a case where electrode cross width D is less than 23 times wavelength λ of elastic waves; (c), (d), and (e), 23 times or more.

In passing characteristics (a) and (b) shown in FIG. 2A, spurious emission S by the transverse mode is occurring between resonance frequency fr and antiresonance frequency fa. Consequently, the admittances are approximately −47 dB and −49 dB. In passing characteristics (c), (d), and (e), meanwhile, spurious emission is well suppressed as compared to (a) and (b), where the admittances are approximately −52 dB, −56 dB, and −53 dB.

As shown in FIG. 2A, as electrode cross width D of interdigital electrode 11a is increased, spurious emission by the transverse mode decreases relatively. Spurious emission by the transverse mode occurs between first bus bar 33 and second bus bar 35, particularly in an area where both electrode fingers 34 and 36 cross, due to generation of standing waves of the transverse mode. However, as electrode cross width D is increased, harmonics of the transverse mode increase, causing transverse-mode spurious emission to disperse. Consequently, energy of lower-order transverse-mode spurious emission is assumed to decrease, which reduces spurious emission generated between resonance frequency fr and antiresonance frequency fa.

In this way, with elastic-wave resonator 11 on the parallel arm, making electrode cross width D of interdigital electrode 11a 23 times or more of wavelength λ of elastic waves enables suppressing spurious emission by the transverse mode. In this way, with ladder-type filter 7 of the embodiment, electrode cross width D is made longer than wavelength λ of elastic waves, which increases the resistance of the resonator. However, with elastic-wave resonator 11 on the parallel arm being an elastic-wave resonator with electrode cross width D 23 times or more of wavelength λ of elastic waves, spurious emission by the transverse mode can be suppressed to prevent the insertion loss from increasing.

Ladder-type filter 7 of this embodiment does not need to increase the number of electrode finger pairs, which enables downsizing.

Further, at least one of electrode cross widths Da and Db of interdigital electrodes 9a and 10a of elastic-wave resonators 9 and 10 on the series arms is desirably less than 23 times wavelength λ of elastic waves. This enables securing a large number of electrode finger pairs of elastic-wave resonators 9 and 10 on the series arms, thereby suppressing the resonator resistance to reduce the insertion loss of the ladder-type filter 7.

Ladder-type filter 7 of this embodiment is effective particularly for a communication system using a passband of less than 1 GHz. The distance (pitch) between electrode fingers of interdigital electrode 9a to 12a is substantially proportional to the wavelength. Accordingly, in a communication system using a passband of less than 1 GHz, the pitch between electrode fingers needs to be approximately 2 μm or larger.

Figure 6:
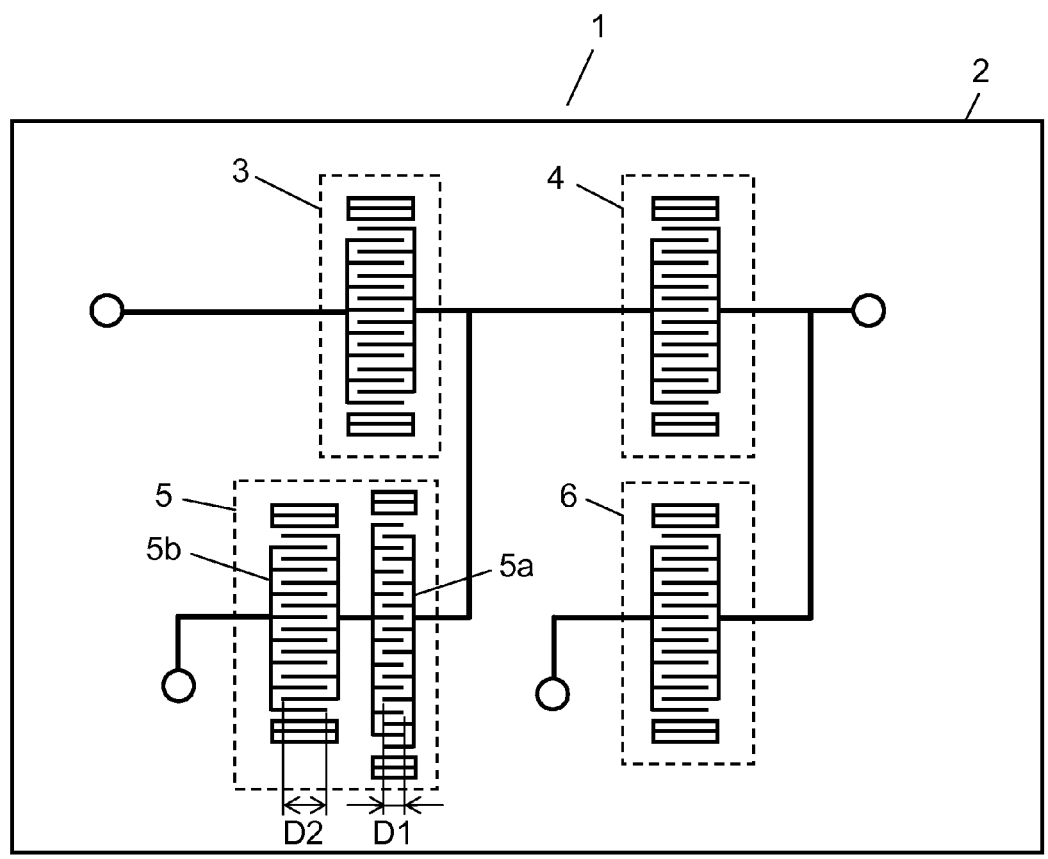
FIG. 6 is a schematic plan view showing a configuration of a conventional ladder-type filter.

The impedance of interdigital electrode 9a to 12a composing ladder-type filter 7 is substantially inversely proportional to the product of capacitance C and a frequency, and thus when impedance of the interdigital electrode stays constant, the number of electrode finger pairs needs to be increased to make the capacitance of interdigital electrode 9a to 12a higher at a lower frequency. Accordingly, when interdigital electrodes 5a and 5b are connected in series like conventional ladder-type filter 1 shown in FIG. 6, the width of the electrode fingers in the arrangement direction results in being extremely large. For example, the width of the electrode fingers of the interdigital electrode in the arrangement direction for a passband of 1 GHz is approximately 4 times that of 2 GHz.

Meanwhile, according to ladder-type filter 7 of this embodiment, spurious emission by the transverse mode can be suppressed without increasing the width of electrode fingers 34, 36 in the arrangement direction. Accordingly, the effect of downsizing becomes more prominent at a lower frequency, and thus ladder-type filter 7 according to the embodiment is particularly useful for a system using a passband of less than 1 GHz.

Next, a description is made of another configuration example of ladder-type filter 7 according to the embodiment.

Figure 3:
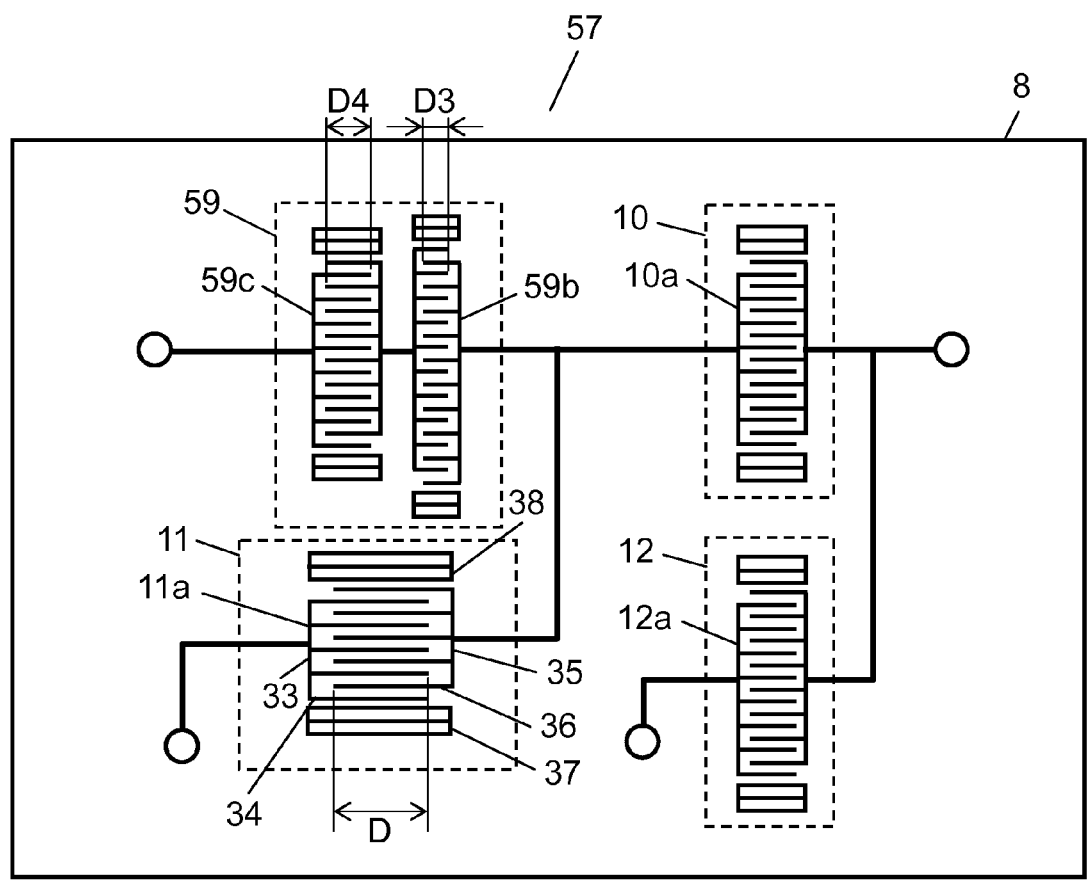
FIG. 3 is a schematic plan view showing another configuration example of the ladder-type filter according to the embodiment of the present invention.

FIG. 3 is a schematic plan view showing another configuration example of the ladder-type filter according to the embodiment of the present invention.

As shown in FIG. 3, ladder-type filter 57 is different from ladder-type filter 7 shown in FIG. 1 in the configuration of elastic-wave resonator 59 on the series arm.

Elastic-wave resonator 59 on the series arm of ladder-type filter 57 has a configuration in which interdigital electrodes 59b and 59c of sub-resonators are connected to each other in series, and electrode cross width D3 of interdigital electrode 59b is made different from electrode cross width D4 of interdigital electrode 59c.

For ladder-type filter 57, elastic-wave resonators 11, 12 on the parallel arms and elastic-wave resonator 10 on the series arm have a configuration common to ladder-type filter 7 shown in FIG. 1.

With the configuration, ladder-type filter 57 using elastic-wave resonator 59 includes above-described elastic-wave resonator 11 on the parallel arm, thus suppressing spurious emission by the transverse mode.

In elastic-wave resonator 59 provided on the series arm of ladder-type filter 57 shown in FIG. 3, plural interdigital electrodes 59b, 59c are connected to each other in series, and respective electrode cross widths D3, D4 are made different from each other, which suppresses spurious emission by the transverse mode while implementing power durability.

In ladder-type filter 57, elastic-wave resonator 59 on the series arm and elastic-wave resonator 11 on the parallel arm are placed adjacent to each other. As shown in FIG. 3, when interdigital electrodes 59b and 59c are connected to each other in series to form elastic-wave resonator 59, the number of electrode finger pairs of interdigital electrodes 59b and 59c increases, so does the size of elastic-wave resonator 59.

Even in this case, to suppress spurious emission by the transverse mode in adjacent elastic-wave resonator 11 on the parallel arm, electrode cross width D is desirably 23 times or more of wavelength λ of elastic waves. In other words, interdigital electrodes 59b and 59c of elastic-wave resonator 59 desirably have a larger number of electrode finger pairs than interdigital electrode 11a of adjacent elastic-wave resonator 11, and electrode cross widths D3, D4 are smaller than width D.

This configuration prevents the number of electrode finger pairs from increasing in both elastic-wave resonators 59 and 11 adjacent to each other, which provides further smaller ladder-type filter 57 while ensuring power durability and suppressing spurious emission by the transverse mode.

Here, a description is made of yet another example of a ladder-type filter according to the embodiment.

Figure 4:
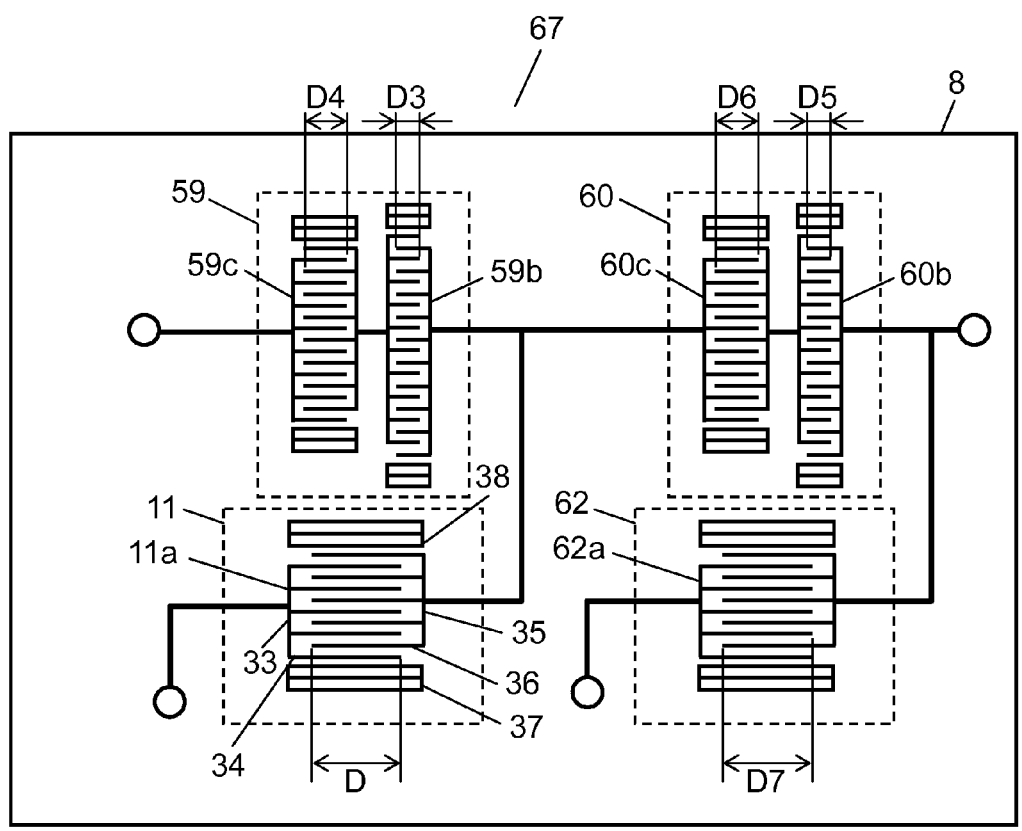
FIG. 4 is a schematic plan view showing yet another configuration example of the ladder-type filter according to the embodiment of the present invention.

FIG. 4 is a schematic plan view showing yet another configuration example of the ladder-type filter according to the embodiment of the present invention. As shown in FIG. 4, ladder-type filter 67 is different from ladder-type filter 57 shown in FIG. 3 in the configuration of elastic-wave resonator 60 on the series arm and elastic-wave resonator 62 on the parallel arm. In elastic-wave resonator 60, interdigital electrodes 59b and 59c of sub-resonators are connected to each other in series, and electrode cross width D5 of interdigital electrode 60b is made different from electrode cross width D6 of interdigital electrode 60c. Elastic-wave resonator 59 on the series arm and elastic-wave resonator 11 on the parallel arm of ladder-type filter 67 have a configuration common to ladder-type filter 57 shown in FIG. 3.

Here, as shown in FIG. 4, electrode cross width D7 of interdigital electrode 62a of elastic-wave resonator 62 on the parallel arm of ladder-type filter 67 may be 23 times or more of wavelength λ of elastic waves, in the same way as in elastic-wave resonator 11. This configuration enables implementing a ladder-type filter satisfying both suppressing spurious emission by the transverse mode and downsizing.

In the above-described ladder-type filters 7, 57, and 67, each elastic-wave resonator may have a dielectric film on its top surface. Here, elastic-wave resonator 11 on the parallel arm is described as an example.

Figure 5A:
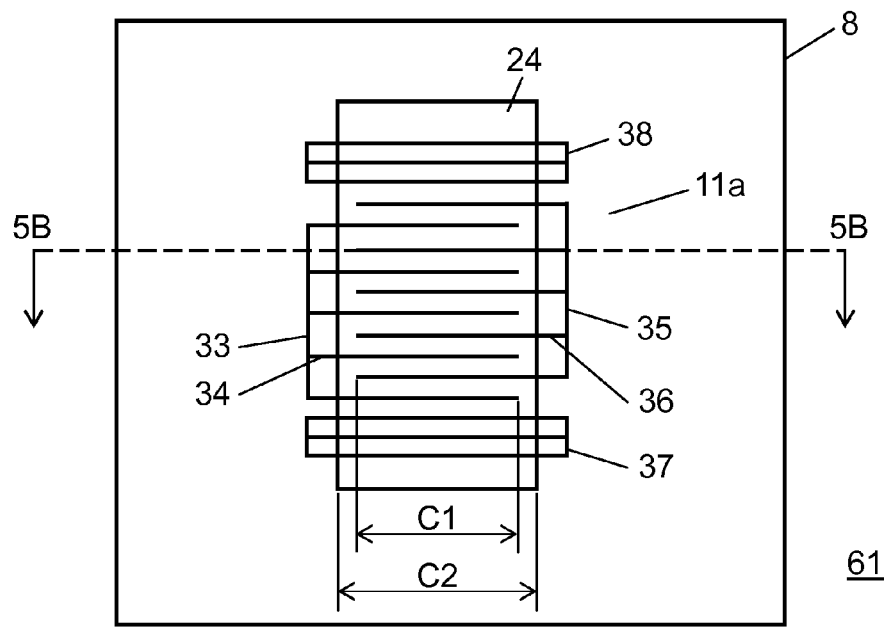
FIG. 5A is a schematic plan view showing another configuration example of an elastic-wave resonator on a parallel arm of the ladder-type filter according to the embodiment of the present invention.
Figure 5B:
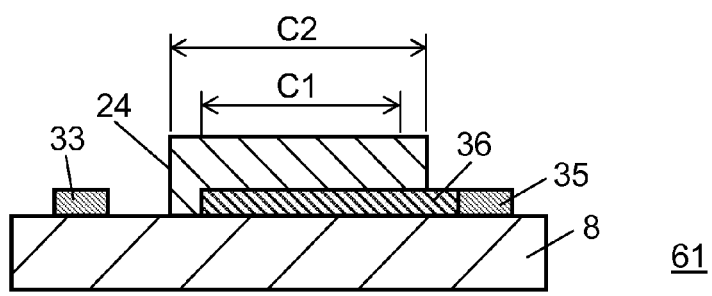
FIG. 5B is a sectional view showing yet another configuration example of an elastic-wave resonator on a parallel arm of the ladder-type filter according to the embodiment of the present invention.

FIG. 5A is a schematic plan view showing another configuration example of an elastic-wave resonator on a parallel arm of the ladder-type filter according to the embodiment of the present invention. FIG. 5B is a schematic plan view showing yet another configuration example of an elastic-wave resonator on a parallel arm of the ladder-type filter according to the embodiment of the present invention. As shown in FIG. 5A, interdigital electrode 11a and reflectors 37, 38 of elastic-wave resonator 61 have a configuration common to elastic-wave resonator 11 of ladder-type filter 7 shown in FIG. 1. Elastic-wave resonator 61 is provided with dielectric film 24 on piezoelectric substrate 8 so as to cover cross area C1 where electrode fingers 34 and electrode finger 36 cross.

Further, as shown in FIG. 5B, dielectric film 24 is provided on piezoelectric substrate 8 so as to cover at least cross area C1. In this embodiment, the film thickness of electrode fingers 34, 36 is 3,440 Å (angstrom) (film thickness normalized by wavelength is 8%), and that of dielectric film 24 is 15,000 Å (angstrom) (normalized film thickness is 35%). Thus, making the film thickness of dielectric film 24 larger than that of electrode fingers 34, 36 enables suppressing spurious emission resulting from unnecessary Rayleigh waves that appear around the resonance frequency of interdigital electrode 11a.

In this way, when interdigital electrode 11a is provided with dielectric film 24 on piezoelectric substrate 8 so as to cover cross area C1 where electrode fingers 34 and 36 cross, both ends of dielectric film 24 become a boundary of transverse-mode waves, which produces transverse-mode standing waves within width C2 of dielectric film 24. Hence, with the configuration of elastic-wave resonator 61 shown in FIGS. 5A and 5B, making width C2 of dielectric film 24 23 times or more of wavelength λ of elastic waves excited by interdigital electrode 11a enables suppressing spurious emission by the transverse mode. Instead, the width of cross area C1 may be the same as width C2 of dielectric film 24. This configuration enables suppressing spurious emission by the transverse mode more effectively.

Figure 5C:
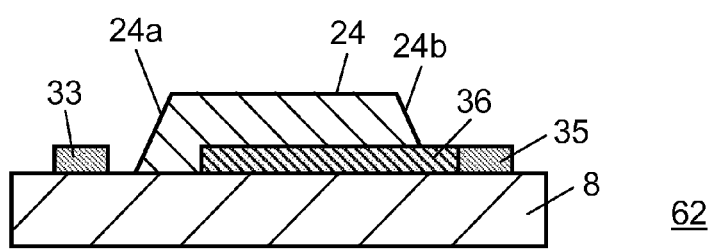
FIG. 5C is a sectional view showing still another configuration example of an elastic-wave resonator on a parallel arm of the ladder-type filter according to the embodiment of the present invention.

FIG. 5C is a sectional view showing still another configuration example of an elastic-wave resonator on a parallel arm of the ladder-type filter according to the embodiment of the present invention. As shown in FIG. 5C, side surfaces 24a and 24b facing first bus bar 33 and second bus bar 35 of dielectric film 24 of elastic-wave resonator 62 may be tapered with a heightwise inclination. Making either of side surface 24a or 24b of dielectric film 24 thus tapered enables varying heightwise the wavelengths of transverse-mode standing waves generated between first bus bar 33 and second bus bar 35. This enables dispersing spurious emission by the transverse mode effectively.

Here, dielectric film 24 for elastic-wave resonator 61 shown in FIG. 5B and elastic-wave resonator 62 shown in FIG. 5C desirably use a medium (e.g. silicon dioxide (SiO2)) having frequency-temperature characteristics inverse to piezoelectric substrate 8. This medium exhibits better frequency-temperature characteristics of the ladder-type filter.

Dielectric film 24 is formed onto piezoelectric substrate 8 so as to cover at least cross area C1 where electrode finger 34 and electrode finger 36 cross by such as sputtering, vapor deposition, or chemical vapor deposition (CVD). Here, the top surface of dielectric film 24 may be uneven so that the top parts of electrode fingers 34, 36 are convex. This shape enables effectively suppressing spurious emission by the Rayleigh mode.

As described above, the present invention enables a ladder-type filter to suppress spurious emission by the transverse mode while downsizing the filter, and thus is useful for such as a mobile phone and a wireless LAN terminal.

What is claimed is:

1. A ladder-type filter formed on a piezoelectric substrate, the ladder-type filter comprising:
   a plurality of elastic-wave resonators provided on a series arm and a parallel arm in a ladder shape on the piezoelectric substrate;
   an interdigital electrode provided in each of the plurality of elastic-wave resonators;
   a first bus bar provided in each of the plurality of elastic-wave resonators;
   a second bus bar provided in each of the plurality of elastic-wave resonators; and
   electrode finger pairs formed of a first electrode finger extending from the first bus bar and a second electrode finger extending from the second bus bar,
   wherein the interdigital electrode included in the elastic-wave resonator provided on the parallel arm has an electrode cross width specified by the first electrode finger and the second electrode finger, and the electrode cross width is 23 times or more of a wavelength of an elastic wave excited by the interdigital electrode,
   wherein a dielectric film is provided on a top part of an area at which the first electrode fingers and the second electrode fingers cross, and
   wherein at least one of a side surface facing the first bus bar and a side surface facing the second bus bar, of the dielectric film has a heightwise inclination.

2. A ladder-type filter formed on a piezoelectric substrate, the ladder-type filter comprising:
   a plurality of elastic-wave resonators provided on a series arm and a parallel arm in a ladder shape on the piezoelectric substrate;
   an interdigital electrode provided in each of the plurality of elastic-wave resonators;
   a first bus bar provided in each of the plurality of elastic-wave resonators;
   a second bus bar provided in each of the plurality of elastic-wave resonators; and
   electrode finger pairs formed of a first electrode finger extending from the first bus bar and a second electrode finger extending from the second bus bar,
   wherein the interdigital electrode included in the elastic-wave resonator provided on the parallel arm has an electrode cross width specified by the first electrode finger and the second electrode finger, and the electrode cross width is 23 times or more of a wavelength of an elastic wave excited by the interdigital electrode,
   wherein the interdigital electrode included in the elastic-wave resonator provided on the parallel arm includes a dielectric film on a top part of an area at which the first electrode fingers and the second electrode fingers cross,
   wherein a width of the dielectric film is 23 times or more of a wavelength of an elastic wave excited by the interdigital electrode included in the elastic-wave resonator provided on the parallel arm, and
   wherein at least one of a side surface facing the first bus bar and a side surface facing the second bus bar, of the dielectric film has a heightwise inclination.

* * * * *